United States Patent
García González et al.

(10) Patent No.: US 11,031,949 B2
(45) Date of Patent: Jun. 8, 2021

(54) ANALOG-TO-DIGITAL CONVERTER, SENSOR ARRANGEMENT AND METHOD FOR ANALOG-TO-DIGITAL CONVERSION

(71) Applicant: ams AG, Premstaetten (AT)

(72) Inventors: Jose Manuel García González, Paterna (ES); Rafael Serrano Gotarredona, Valencia (ES)

(73) Assignee: AMS AG, Premstaetten (AT)

( * ) Notice: Subject to any disclaimer, the term of this patent is extended or adjusted under 35 U.S.C. 154(b) by 61 days.

(21) Appl. No.: 16/492,711

(22) PCT Filed: Mar. 20, 2018

(86) PCT No.: PCT/EP2018/056966
§ 371 (c)(1),
(2) Date: Sep. 10, 2019

(87) PCT Pub. No.: WO2018/172326
PCT Pub. Date: Sep. 27, 2018

(65) Prior Publication Data
US 2021/0143835 A1    May 13, 2021

(30) Foreign Application Priority Data

Mar. 23, 2017 (EP) .................... 17162564

(51) Int. Cl.
*H03M 3/00* (2006.01)
*H03M 1/46* (2006.01)

(52) U.S. Cl.
CPC ............. *H03M 3/34* (2013.01); *H03M 1/462* (2013.01); *H03M 3/464* (2013.01); *H03M 3/496* (2013.01)

(58) Field of Classification Search
CPC ........ H03M 3/34; H03M 3/496; H03M 3/464; H03M 1/462
USPC .................................................. 341/143, 155
See application file for complete search history.

(56) References Cited

U.S. PATENT DOCUMENTS

| | | | |
|---|---|---|---|
| 7,825,838 B1 * | 11/2010 | Srinivas | H03M 1/1023 341/121 |
| 2009/0140897 A1 | 6/2009 | Healy et al. | |
| 2011/0163901 A1 | 7/2011 | Quiquempoix et al. | |

OTHER PUBLICATIONS

Yousefzadeh, B. et al: "A generic readout circuit for resistive transducers" 2015 6th International Workshop on Advances in Sensors and Interfaces (IWASI), pp. 122-125 (Jun. 1, 2015).
Quiquempoix, V. et al: "A low-power 22-bit incremental ADC" IEEE Journal of Solidstate Circuits, IEEE Service Center, Piscataway, NJ, US; vol. 41, No. 7, pp. 1562-1571 (Jul. 1, 2006).

(Continued)

*Primary Examiner* — Khai M Nguyen
(74) *Attorney, Agent, or Firm* — MH2 Technology Law Group LLP

(57) ABSTRACT

An analog-to-digital converter comprises a first integrator (40), a first converter input (19), a first reference voltage input (34), a capacitor array (68) comprising capacitor elements (171), and a rotation frequency control unit (37) providing a rotation signal (SRO) with at least two different values of a rotation frequency (fR). A first subset of capacitor elements (171) of the capacitor array (68) is coupled to the first converter input (19) and to an input side of the first integrator (40) in a first phase and is coupled to the first reference voltage input (34) and to the input side of the first integrator (40) in a second phase as a function of the rotation signal (SRO).

14 Claims, 8 Drawing Sheets

(56) References Cited

OTHER PUBLICATIONS

De la Rosa, J. et al.: "A CMOS 110dB@40-kS/s Programmable-Gain chopper-stabilized Third order 2-1 cascade sigma-delta modulator for low-power high-linearity automotive sensor ASICs" IEEE Journal of Solid-State Circuits, vol. 40, No. 11, pp. 2246 (Nov. 2005).
Garcia-Gonzalez, J. et al: "A 0.35um 17-bit@40kS/s Sensor and A/D interface based on a programmable-gain cascade 2-1 Sigmadelta Modulator" ISCAS, pp. 205-208 (2004).
Pertijs, M. et al.: "Precision Temperature Sensors in CMOS Technology" Springer, Analog circuits and signal processing series, pp. 252-257 (2006).
European Patent Office, International Search Report for PCT/EP2018/056966, dated Jun. 13, 2018.

* cited by examiner

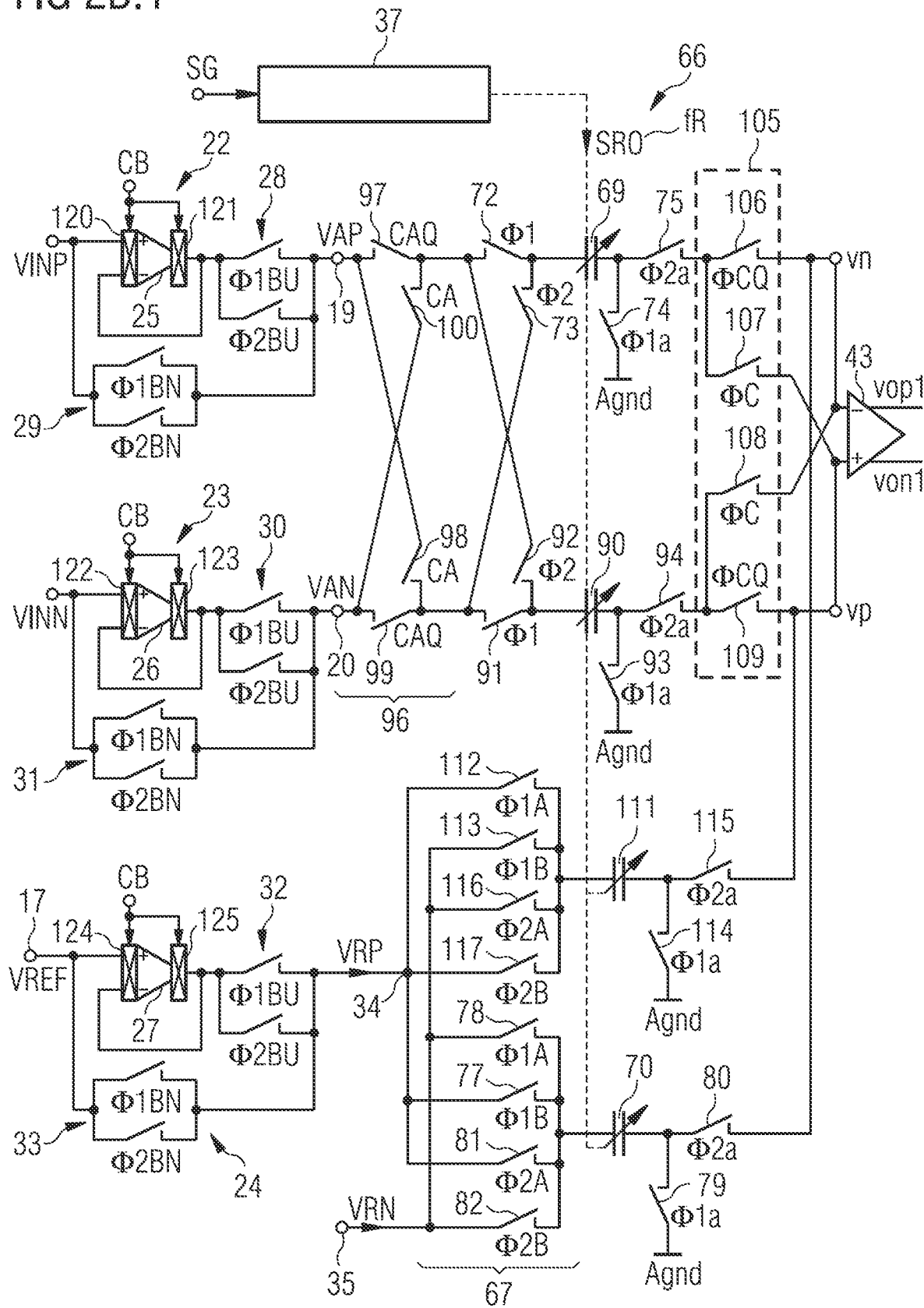
FIG 2B.1

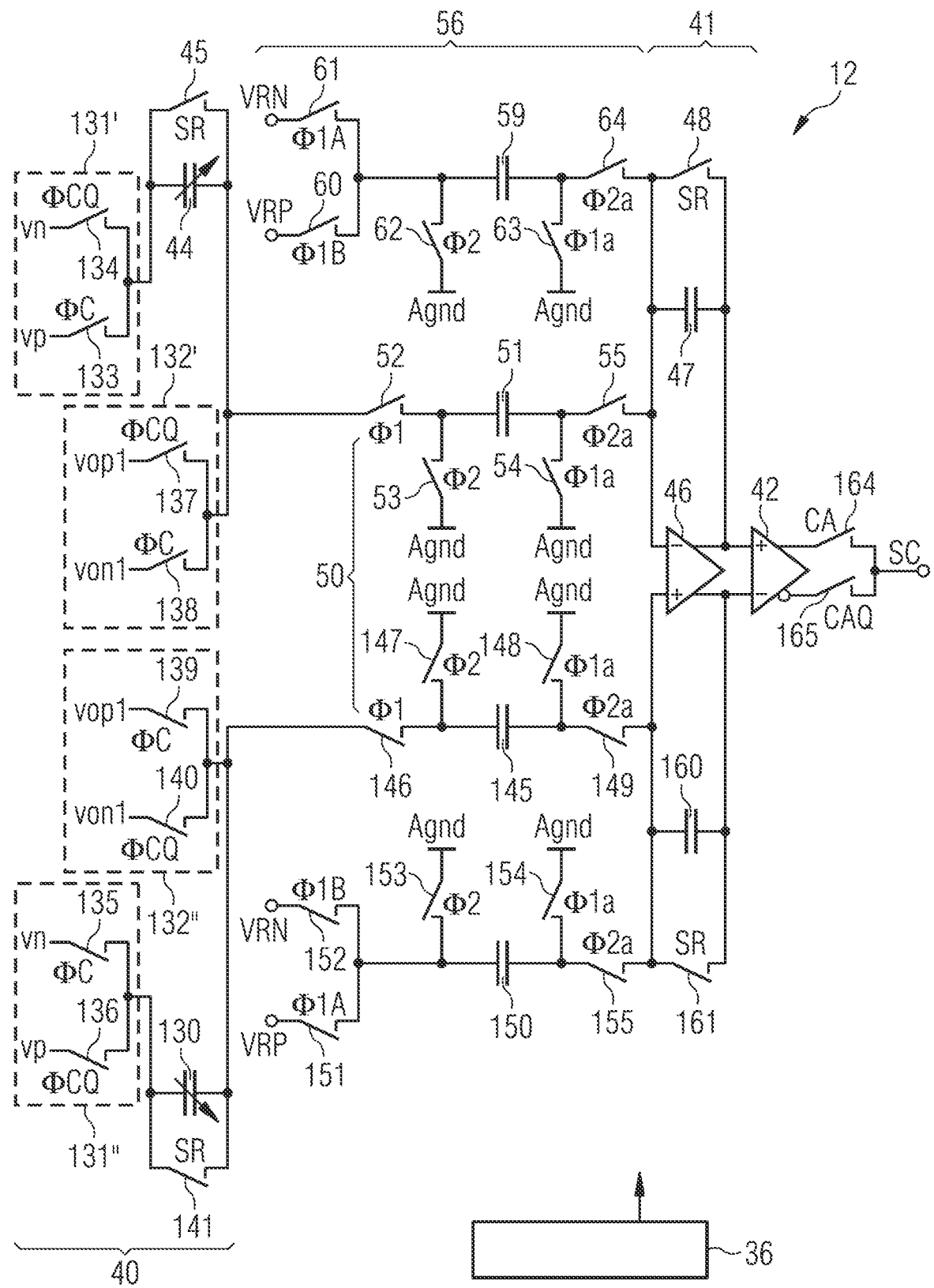
FIG 2B.2

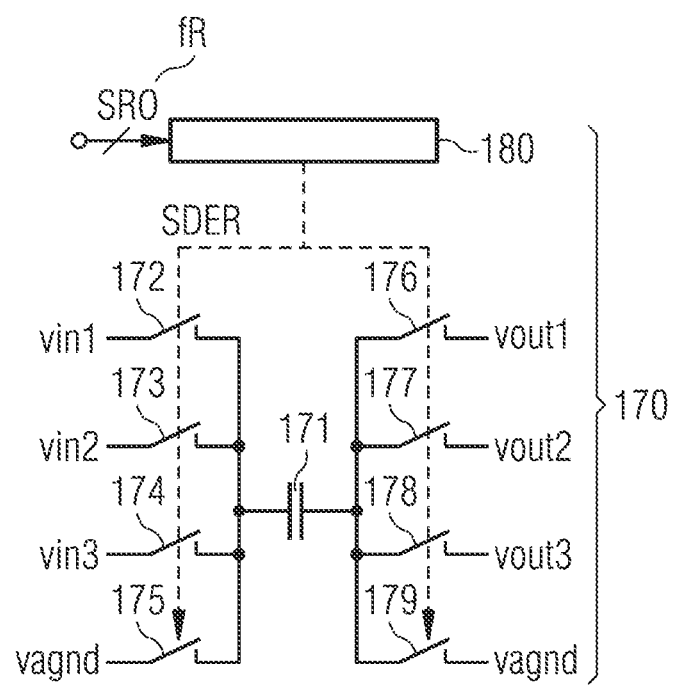

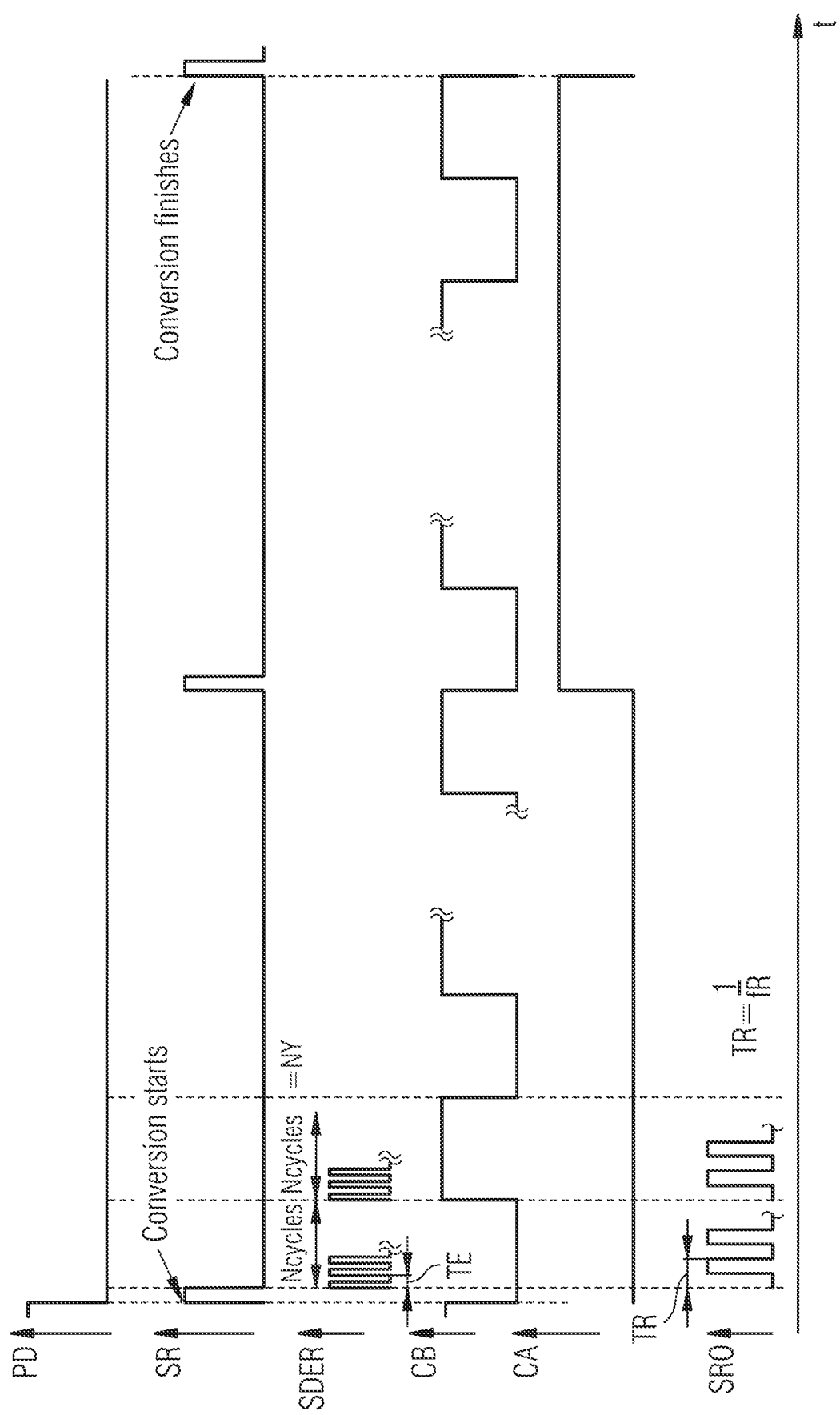

ANALOG-TO-DIGITAL CONVERTER, SENSOR ARRANGEMENT AND METHOD FOR ANALOG-TO-DIGITAL CONVERSION

CROSS-REFERENCE TO RELATED APPLICATIONS

The present application is the national stage entry of International Patent Application No. PCT/EP2018/056966, filed on Mar. 20, 2018, which claims the benefit of priority of European Patent Application No. 17162564.3, filed on Mar. 23, 2017, all of which are hereby incorporated by reference in their entirety for all purposes.

BACKGROUND OF THE INVENTION

The present patent application is related to an analog-to-digital converter, a sensor arrangement and a method for analog-to-digital conversion.

A sensor can be used to measure a parameter such as a physical or a chemical parameter. A sensor signal provided by the sensor is often digitized by an analog-to-digital converter, abbreviated AD converter. Such an AD converter may have a high resolution in order to accurately digitize the sensor signal.

SUMMARY OF THE INVENTION

In an embodiment, an analog-to-digital converter comprises a first integrator, a first converter input, a first reference voltage input, a capacitor array comprising capacitor elements, and a rotation frequency control unit providing a rotation signal with at least two different values of a rotation frequency. A first subset of capacitor elements of the capacitor array is coupled to the first converter input and to an input side of the first integrator in a first phase and is coupled to the first reference voltage input and to the input side of the first integrator in a second phase as a function of the rotation signal.

Advantageously, the rotation of the first subset of capacitor elements reduces the influence of tolerances of the capacitance values of the capacitor elements. Due to the use of different frequency values, the resolution is further improved. The rotation signal is a digital signal. The rotation signal has a frequency which is named rotation frequency to differentiate this frequency from other frequencies in the analog-to-digital converter.

In an embodiment, a subset of capacitor elements of the capacitor array which is coupled to the first converter input and to the input side of the first integrator at a point of time forms a sampling capacitor. A subset of capacitor elements of the capacitor array which is coupled to the first reference voltage input and to the input side of the first integrator at a point of time forms a feedback capacitor.

In an embodiment, the first subset forms or is part of the sampling capacitor in the first phase. The first subset forms or is part of the feedback capacitor in the second phase.

A value of the rotation frequency of the rotation signal may depend on a gain signal.

In an embodiment, the rotation frequency of the rotation signal may not linearly depend on the gain signal.

In an alternative embodiment, the rotation frequency of the rotation signal may linearly depend on the gain signal. The rotation frequency of the rotation signal may linearly rise with a rising gain signal. The rotation frequency of the rotation signal may linearly decrease with a rising gain signal.

In an embodiment, a gain of the first integrator is set by the gain signal. Alternatively, a gain of the AD converter is set by the gain signal. The rotation frequency depends on the used or set gain of the first integrator or of the AD converter. The rotation frequency is adapted to the used or set gain. The gain signal is a variable signal.

In an embodiment, the first integrator comprises a first amplifier and a first integrating capacitor having a number of further capacitor elements. A subset of the further capacitor elements of the first integrating capacitor is coupled to an input of the first amplifier and to an output of the first amplifier. The number of further capacitor elements in the subset is a function of the gain signal.

Advantageously, the further capacitor elements of the first integrating capacitor may not be coupled to the first converter input and to an input side of the first integrator in any phase and may not be coupled to the first reference voltage input and to the input side of the first integrator in any phase. Thus, the first integrating capacitor is realized separately from the sampling capacitor and the feedback capacitor.

In an embodiment, the AD converter is implemented as a sigma-delta AD converter. The analog-to-digital converter can be abbreviated AD converter.

In an embodiment, a first converter voltage is tapped at the first converter input.

In an embodiment, a capacitor element changes its location at the rotation frequency. One of the capacitor elements may change its location at the rotation frequency. A capacitor element of the first subset of capacitor elements may change its location at the rotation frequency. Alternatively, each capacitor element of the first subset of capacitor elements may change its location at the rotation frequency.

In an embodiment, mismatches between the capacitor elements may be observed at the output spectrum of the AD converter as a tone. Advantageously, by choosing an appropriate value of the rotation frequency, the frequency of this tone can be set. For example, since the number of rotating capacitors are not the same for different gain values, the rotation frequency may be set on one of at least two values in order to get the tone due to capacitor mismatches at the same frequency or several predetermined frequencies outside of the band of interest. If in an alternative AD converter the frequency at which the capacitor elements or unit elements change their position is fixed for all gain settings, then the frequency tone due to the capacitor mismatches will change its position in the spectrum for each gain setting. The tone will move to lower frequencies when more capacitor elements or unit elements are used and vice versa. In the disclosed AD converter, the frequency at which the capacitor elements or unit elements change their position is increased or decreased depending on the capacitor elements or unit elements which need to be rotated (gain setting). Thus, the tone due to the capacitor mismatches is set outside of the band of interest of the AD converter.

In an embodiment, the AD converter comprises a second integrator having an input side coupled to an output side of the first integrator. The AD converter comprises a comparator having an input side coupled to an output side of the second integrator.

In an embodiment, the AD converter comprises a filter coupled to the output side of the comparator. The filter is a digital filter. The filter may be a digital decimation filter, low pass filter, band-stop filter or notch filter. The filter generates a digital output signal. The first converter voltage may be digitized into the digital output signal. The digital output signal may be the digital equivalent of the first converter voltage.

In an embodiment, the AD converter is realized as a differential AD converter and comprises a second converter input and a second reference voltage input. The capacitor array couples the second converter input and the second reference voltage input to the input side of the first integrator. A second converter voltage may be tapped at the second converter input.

In an embodiment, a sensor arrangement comprises the AD converter and a resistive sensor that is coupled to the first converter input. A first converter voltage that is tapped at the first converter input is a function of a parameter measured by the resistive sensor.

In an embodiment, the sensor arrangement comprises a first buffer coupled on its input side to the resistive sensor and on its output side to the first converter input. The first buffer may be realized as a chopping buffer. The sensor arrangement may comprise a reference buffer coupled on its input side to a reference voltage pin and on its output side to the first reference voltage input. The reference buffer may be realized as a chopping buffer. The sensor arrangement may comprises a second buffer coupled on its input side to the resistive sensor and on its output side to the second converter input. The second buffer may be realized as a chopping buffer.

In an embodiment, the AD converter is realized as a high input impedance, low gain and offset drift merged PGA-AD converter. A programmable-gain amplifier can be abbreviated PGA. A generic signal acquisition front-end may be composed of a PGA and the AD converter. Advantageously, the front-end may have a very high-input impedance. One application of the sensor arrangement may be the measurement of resistive sensors.

In an embodiment, a method for analog-to-digital conversion comprises providing a first converter voltage that is tapped at a first converter input and a first reference voltage that is tapped at a first reference voltage input via a capacitor array to an integrator, and providing a rotation signal by a rotation frequency control unit with a first value of a rotation frequency or alternatively with at least a second value of the rotation frequency. The capacitor array comprises capacitor elements. A first subset of capacitor elements of the capacitor array is coupled to the first converter input and to an input side of the first integrator in a first phase and is coupled to the first reference voltage input and to the input side of the first integrator in a second phase as a function of the rotation signal.

In an embodiment, the rotation frequency has the first value in a conversion cycle of the AD converter and the at least a second value in another conversion cycle of the AD converter.

In an embodiment, the rotation frequency is the inverse of the period of the rotation signal.

In an embodiment, the rotation signal sets a duration of the first phase and a duration of the second phase. The duration of the first phase and the duration of the second phase may be equal. The duration is equal to the inverse of the rotation frequency of the rotation signal. Advantageously, the duration of the first and of the second phase is not constant. The duration of the first and of the second phase is different in different conversion cycles of the AD converter. Thus, the influence of a possible mismatch of the capacitor elements is reduced. The second phase may directly follow the first phase.

In an alternative embodiment, the sum of the duration of the first phase and of the duration of the second phase is equal to the inverse of the rotation frequency of the rotation signal.

In an embodiment, a comparator output signal is provided by a comparator that is coupled via a second integrator to the output side of the first integrator.

In an embodiment, a filter may be coupled to the output side of the comparator. The filter may be realized as a band-stop filter that passes most frequencies unaltered, but attenuates those in a specific range to very low levels. The filter may be a notch filter. The notch filter is a band-stop filter with a narrow stopband at a notch frequency.

In an embodiment, a value of the rotation frequency fR at which a capacitor element is changing its location is given by the equation:

$$fR = \left(k \cdot \frac{M+N}{gcd(M,N)}\right) \cdot fN,$$

wherein k is an integer number, M is the number of capacitor elements of the capacitor array coupled to the first converter input and to an input side of the first integrator in the first phase, N is the number of capacitor elements of the capacitor array coupled to the first reference voltage input and to an input side of the first integrator in the first phase, gcd is the greatest common divisor and fN is a value of the notch frequency of the filter coupled to the output side of the comparator. k may have the values 1, 2, 3 or more than three.

In an embodiment, the number N and the number M are a function of a gain signal that sets the gain of the AD converter.

In an embodiment, an analog-to-digital converter comprises a first integrator, a first converter input, a first reference voltage input and a capacitor array comprising capacitor elements. A number M of capacitor elements of the capacitor array form a first sampling capacitor and a number N of capacitor elements of the capacitor array form a first feedback capacitor. The first sampling capacitor may be coupled to the first converter input and to an input side of the first integrator in a first phase. The first feedback capacitor may be coupled to a first or a second reference voltage input and to an input side of the first integrator in the first phase.

BRIEF DESCRIPTION OF THE DRAWINGS

The following description of figures of exemplary embodiments may further illustrate and explain aspects of the patent application. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 2A and 2B show exemplary embodiments of an AD converter;

FIG. 3 shows an exemplary embodiment of a detail of the AD converter;

FIGS. 4A and 4B show exemplary embodiments of signals of the AD converter;

DETAILED DESCRIPTION

Figure 1A:
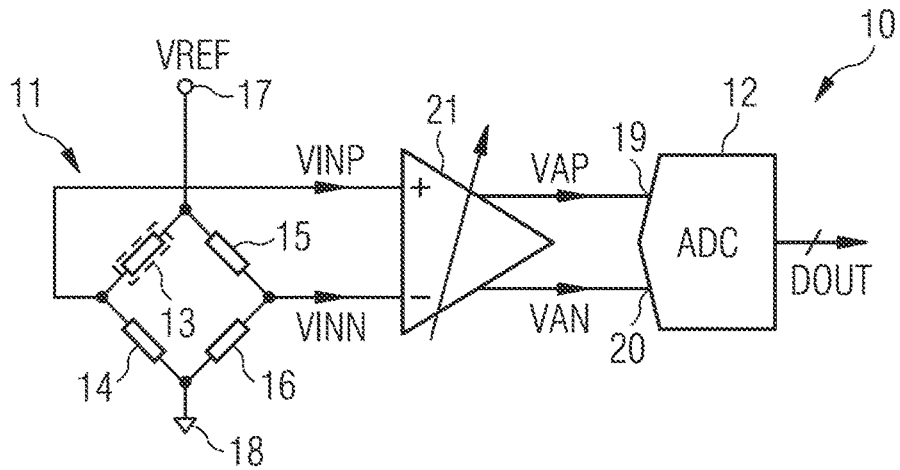
FIGS. 1A and 1B show exemplary embodiments of sensor arrangements.

FIG. 1A shows an exemplary embodiment of a sensor arrangement 10. The sensor arrangement 10 comprises a sensor 11 and an analog-to-digital converter 12 coupled to the sensor 11. The analog-to-digital converter 12 is abbreviated AD converter or ADC. The sensor 11 is realized as a resistive sensor. The sensor 11 comprises a resistive sensor element 13 having a terminal coupled to a converter input 19 of the AD converter 12. The sensor 11 may be realized as a Wheatstone bridge. Thus, the sensor 11 additionally comprises a second, a third and a fourth resistive sensor element 14 to 16. A series circuit of the first and the second resistive sensor element 13, 14 is coupled between a reference voltage terminal 17 and a reference potential terminal 18. A further series circuit comprising the third and the fourth resistive sensor element 15, 16 is also coupled between the reference voltage terminal 17 and the reference potential terminal 18. The first and the third resistive sensor elements 13, 15 are connected to the reference voltage terminal 17. The second and the fourth resistive sensor elements 14, 16 are connected to the reference potential terminal 18.

A resistance value of the first resistive sensor element 13 is a function of a parameter to be measured. The resistance values of the second to the fourth resistive sensor elements 14 to 16 may also be a function of the parameter to be measured. For example the resistance values of the first and the fourth resistive elements 13, 16 may rise with a rising parameter to be measured. Furthermore, the resistance values of the second and the third resistive elements 14, 15 may decrease with a rising parameter to be measured. A node between the first and the second resistive sensor element 13, 14 is coupled to the first converter input 19. Correspondingly, a node between the third and the fourth resistive sensor element 15, 16 is coupled to a second converter input 20. Alternatively, the resistance values of the second and/or third and/or fourth resistive sensor elements 14 to 16 may be constant.

The sensor arrangement 10 may comprise an amplifier 21. The amplifier 21 may be realized as a programmable gain amplifier. The node between the first and the second resistive sensor element 13, 14 is coupled to a first input of the amplifier 21, whereas the node between the third and the fourth resistive sensor element 15, 16 is coupled to a second input of the amplifier 21. The first input may be a non-inverting input and the second input may be an inverting input of the amplifier 21. A first output of the amplifier 21 is coupled to the first converter input 19 and a second output of the amplifier 21 is coupled to the second converter input 20.

A first input voltage VINP can be tapped at the node between the first and the second resistive sensor element 13, 14. A second input voltage VINN can be tapped at the node between the third and the fourth resistive sensor element 15, 16. The amplifier 21 amplifies the first and the second input voltage VINP, VINN and provides a first and a second converter voltage VAP, VAN that are applied to the first and the second converter input 19, 20. A reference voltage VREF can be tapped at the reference voltage terminal 17. The AD converter 12 provides a digital output signal DOUT. The AD converter 12 may comprise a parallel output interface for providing the digital output signal DOUT on parallel bus lines. The digital output signal DOUT may be provided as a word. The digital output signal DOUT may have the form of parallel signals.

The sensor arrangement 10 is implemented as a resistive sensor front-end or a resistance-to-digital converter. Resistive sensors are used in many applications to measure physical or chemical parameters such as humidity, pressure, liquid level, purity, proximity or gas concentration. In order to be accurate enough, the measurement of such a physical or chemical parameter is performed by a high-resolution and low-noise resistance-to-digital converter such as the sensor arrangement 10.

Figure 1B:
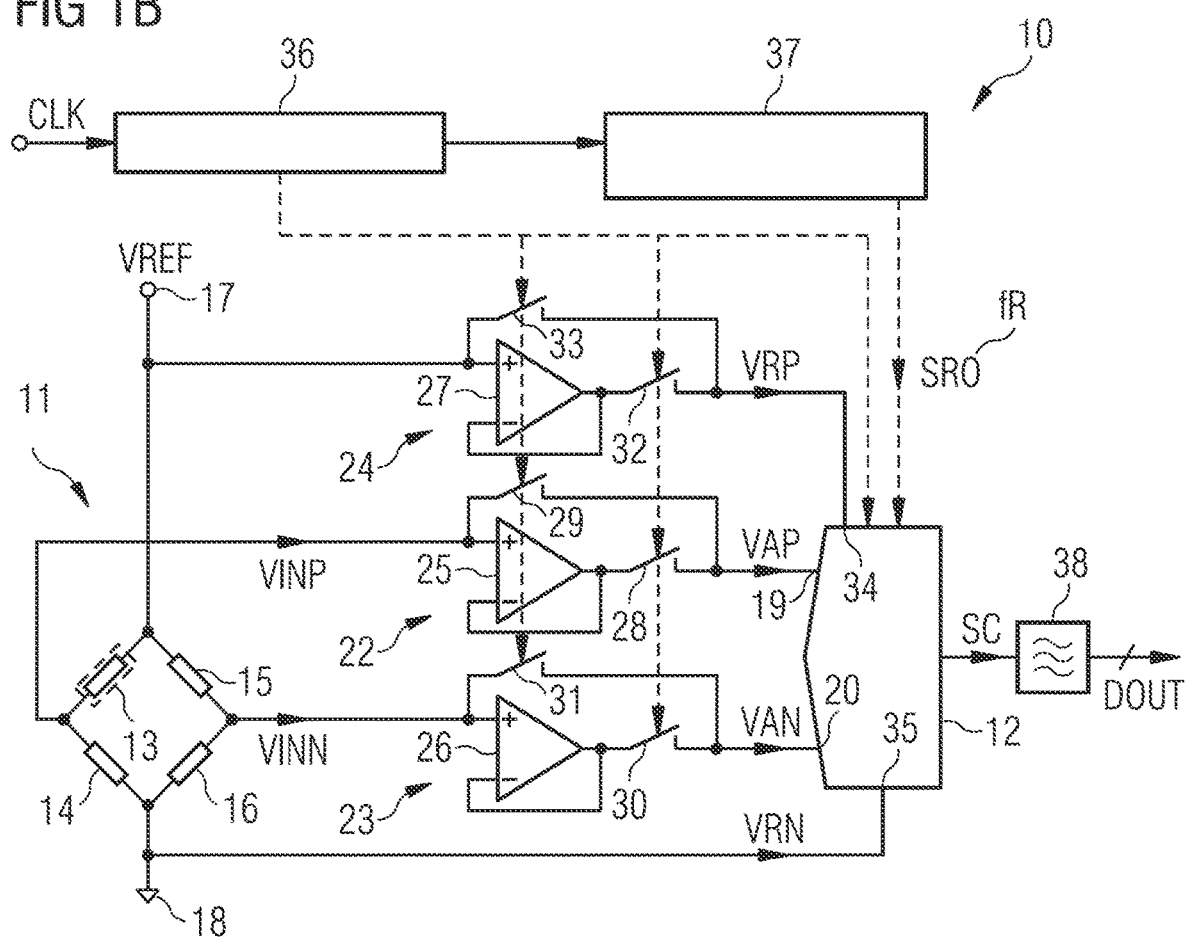

FIG. 1B is a further exemplary embodiment of a sensor arrangement 10 that is a further development of the embodiment shown in FIG. 1A. The AD converter 12 is realized as a sigma-delta AD converter. The function of the amplifier 21 shown in FIG. 1A is included in the AD converter 12. The sensor arrangement 10 comprises a first buffer 22 coupling a terminal of the sensor 11, e.g. the terminal of the first resistive sensor element 13, to the first converter input 19 of the AD converter 12. A second buffer 23 couples another terminal of the sensor 11, e.g. the node between the third and the fourth resistive sensor element 15, 16, to the second converter input 20. A reference buffer 24 couples the reference voltage terminal 17 to a first reference voltage input 34 of the AD converter 12. Moreover, the reference potential terminal 18 is connected to a second reference voltage input 35 of the AD converter 12.

The first, the second and the reference buffer 22 to 24 are each realized as unity gain buffers. The first buffer 22 comprises a buffer amplifier 25. Thus, a first input of the buffer amplifier 25 is connected to the node between the first and the second resistive element 13, 14. A second input of the buffer amplifier 25 is connected to an output of the buffer amplifier 25. The first input of the buffer amplifier 25 is implemented as a non-inverting input and the second input of the buffer amplifier 25 is realized as an inverting input. The output of the buffer amplifier 25 is coupled via a first buffer switch 28 to the first converter input 19. The first converter input 19 is coupled via a second buffer switch 29 to the first input of the buffer amplifier 25. The second buffer 23 and the reference buffer 24 are realized such as the first buffer 22. Thus, the second buffer 23 comprises a further buffer amplifier 26 and a further first and a further second buffer switch 30, 31. Moreover, the reference buffer 24 comprises an additional buffer amplifier 27 and an additional first and an additional second buffer switch 32, 33.

The sensor arrangement 10 comprises a timing control unit 36. Moreover, the sensor arrangement 10 comprises a rotation frequency control unit 37. The timing control unit 36 is connected on its output side to an input of the rotation frequency control unit 37. Moreover, the timing control unit 36 is connected on its output side to the control terminal of the buffer switches 28 to 33 of the first, the second and the reference buffer 22 to 24. The rotation frequency control unit 37 is connected on its output side to the AD converter 12. Additionally, the sensor arrangement 10 comprises a filter 38 with an input connected to an output of the AD converter 12. The filter 38 may be realized as a low pass filter.

Figure 2A:
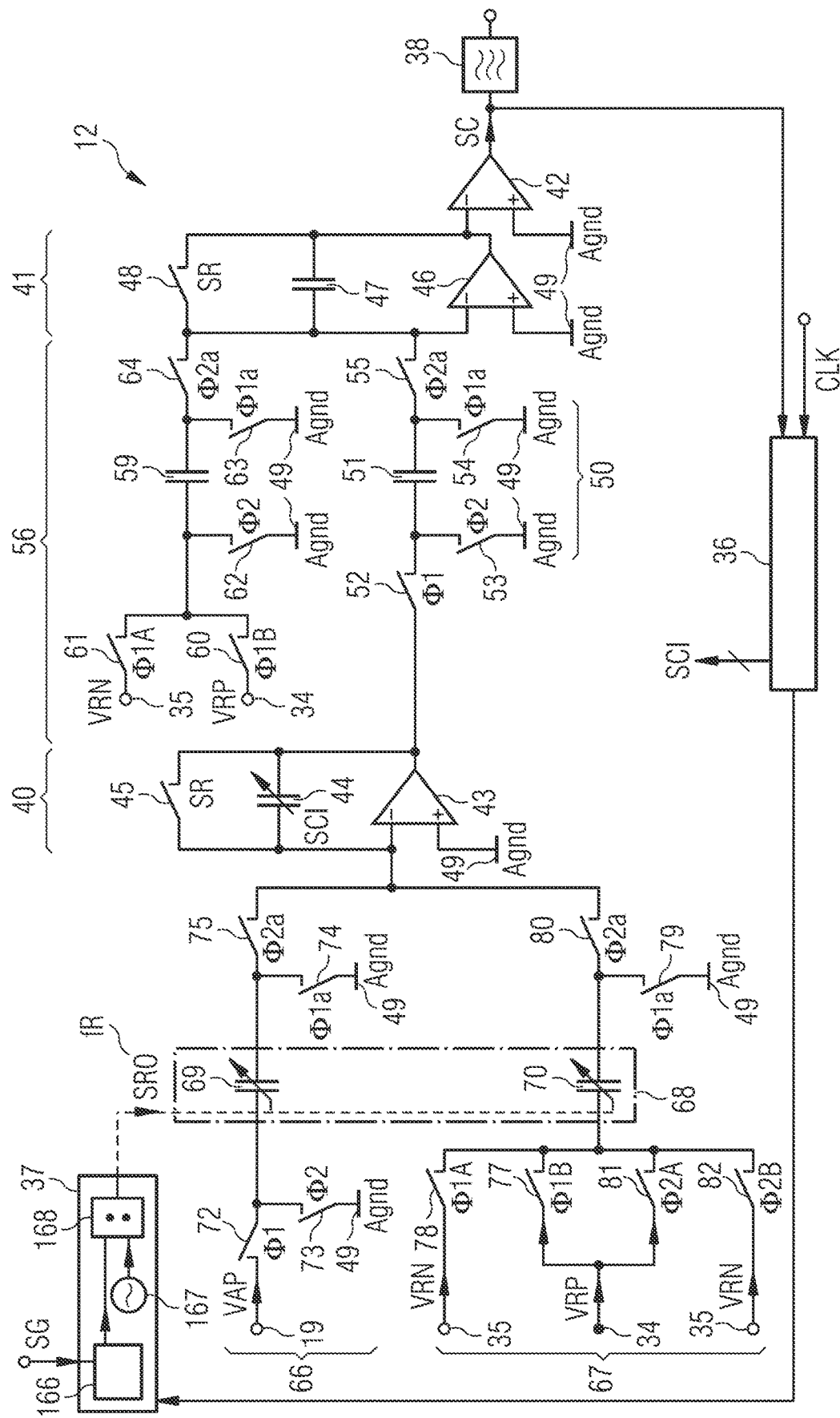

A clock signal CLK is provided to the timing control unit 36. The first buffer 22 generates the first converter voltage VAP that is applied to the first converter input 19. Correspondingly, the second buffer 23 generates the second converter voltage VAN that is provided to the second converter input 20. The reference buffer 24 generates a first reference voltage VRP that is applied to the first reference voltage input 34. A second reference voltage VRN is provided to the second reference voltage input 35. The second reference voltage VRN may be tapped at the reference potential terminal 18. The first reference voltage VRP may be positive with respect to the second reference voltage VRN. The filter 38 generates the digital output signal DOUT using a signal provided by the AD converter 12. For example, the AD converter 12 may provide a bit stream. The AD converter 12 may provide a comparator output signal SC provided by a comparator 42 of the AD converter 12 as shown in FIG. 2A.

The comparator output signal SC may have the form of a bit stream. The filter 38 may generate the digital output signal DOUT using the comparator output signal SC. The filter 38 may have a parallel output interface for providing the digital output signal DOUT on parallel bus lines.

Advantageously, the first reference voltage VRP, the first converter voltage VAP and the second converter voltage VAN are buffered by the three buffers 22 to 24 before they are applied to the AD converter 12.

As shown in FIG. 1B, the sensor 11 is directly connected to a switched capacitor (SC) sigma-delta (SDM) AD converter input. The function of the PGA 21 is merged into the operation of the AD converter 12 by changing the ratio between capacitors, as shown in FIGS. 2A and 2B. The sensor arrangement 12 is implemented as a resistive sensor front-end with merged PGA and AD converter. Sigma-delta modulator is abbreviated SDM. Alternatively, the filter 38 is omitted. The comparator output signal SC is implemented as an output signal of the AD converter 12 and is used for further signal evaluation.

In an alternative embodiment, the AD converter 12 comprises the filter 38. The digital output signal DOUT is implemented as the output signal of the AD converter 12 and is used for further signal evaluation.

FIG. 2A shows an exemplary embodiment of the AD converter 12. The AD converter 12 can be used in the sensor arrangement 10 shown in FIGS. 1A and 1B. The AD converter 12 comprises a first integrator 40 coupled on its input side to the first converter input 19. Moreover, the AD converter 12 comprises a second integrator 41 coupled on its input side to the output side of the first integrator 40 and a comparator 42 coupled on its input side to the output side of the second integrator 41. The AD converter 12 is coupled on its output side to the filter 38. The comparator 42 is coupled on its output side to the input of the filter 38. The filter 38 may be realized as a digital decimation filter.

The first integrator 40 comprises a first amplifier 43, a first integrating capacitor 44 and a first reset switch 45. The first integrating capacitor 44 couples a first input of the first amplifier 43 to an output of the first amplifier 43. The first reset switch 45 couples a first electrode of the first integrating capacitor 44 to a second electrode of the first integrating capacitor 44. A second input of the first amplifier 43 is connected to a ground potential terminal 49. The first input may be realized as an inverting input and the second input of the first amplifier 43 may be realized as a non-inverting input. The first integrating capacitor 44 has a variable capacitance value CINT1. The first integrating capacitor 44 is realized as a capacitor array having capacitor elements. A subset of the capacitor elements of the capacitor array is used for integration by the first integrator 40. The capacitance value CINT1 of the first integrating capacitor 44 is set by a control signal SC1 generated by the timing control unit 36.

The second integrator 41 comprises a second amplifier 46, a second integrating capacitor 47 and a second reset switch 48. The connections of these circuit parts are realized such as the connections of the first integrator 40. The second integrating capacitor 47 may have a constant capacitance value. The capacitance value may be, for example, 2 pF. The output of the second amplifier 46 is connected to a first input of the comparator 42. A second input of the comparator 42 is connected to the ground potential terminal 49. The first input of the comparator 42 is implemented as a non-inverting input, whereas the second input of the comparator 42 is implemented as an inverting input. An output of the comparator 42 is directly connected to an input of the filter 38.

The AD converter 12 is realized as a sigma-delta AD converter. The AD converter 12 comprises a first capacitor switching circuit 50 coupling the output side of the first integrator 40 to the input side of the second integrator 41. The output of the first amplifier 43 is coupled via the first capacitor switching circuit 50 to the first input of the second amplifier 46. The first capacitor switching circuit 50 comprises a first switching capacitor 51 and a first to a fourth switch 52 to 55. The output of the first amplifier 43 and thus the output of the first integrator 40 is coupled via the first switch 52 to a first electrode of the first switching capacitor 51. The first electrode of the first switching capacitor 51 is coupled via the second switch 53 to the ground potential terminal 49. A second electrode of the first switching capacitor 51 is coupled via the third switch 54 to the ground potential terminal 18. The second electrode of the first switching capacitor 51 is coupled via the fourth switch 55 to the input side of the second integrator 41 and thus to the first input of the second amplifier 46.

Additionally, the AD converter 12 comprises a second capacitor switching circuit 56 coupling the first and the second reference voltage input 34, 35 to the input side of the second integrator 41 and thus to the first input of the second amplifier 46. The second capacitor switching circuit 56 comprises a first reference switching capacitor 59 and a first to a fifth reference switch 60 to 64. The first reference voltage input 34 is coupled via the first reference switch 60 to a first electrode of the first reference switching capacitor 59. The second reference voltage input 35 is coupled via the second reference switch 61 to the first electrode of the first reference switching capacitor 59. The first electrode of the first reference switching capacitor 59 is coupled via the third reference switch 62 to the ground potential terminal 49. A second electrode of the first reference switching capacitor 59 is coupled via the fourth reference switch 63 to the ground potential terminal 49. The second electrode of the first reference switching capacitor 59 is coupled via the fifth reference switch 64 to the input side of the second integrator 41 and thus to the input of the second amplifier 46.

Moreover, the AD converter 12 comprises a sampling arrangement 66 coupling the first converter input 19 to the input side of the first integrator 40 and thus to the first input of the first amplifier 43. Moreover, the AD converter 12 comprises a feedback arrangement 67 coupling the first and the second reference voltage input 34, 35 to the input side of the first integrator 40 and thus to the first input of the first amplifier 43.

The AD converter 12 comprises a capacitor array 68 comprising capacitor elements. Each of the capacitor elements may have the same capacitance value, namely a unit capacitance value Cu. The capacitor array 68 is used to realize a first sampling capacitor 69 of the sampling arrangement 66 and a first feedback capacitor 70 of the feedback arrangement 67. Thus, the first sampling capacitor 69 is realized as a variable capacitor having the capacitance value C1. The first feedback capacitor 70 is realized as a variable capacitor having the capacitance value CDAC1. The first sampling capacitor 69 is formed by some of the capacitor elements of the capacitor array 68 at a point of time. Correspondingly, the first feedback capacitor 70 is formed by other capacitor elements of the capacitor array 68 at this point of time. The capacitor array 68 has a control input connected to an output of the rotation frequency control unit 37. The rotation frequency control unit 37 may for example comprise a memory 166 for storing a table. The rotation frequency control unit 37 may comprise an oscillator 167 and a frequency divider 168 coupling the oscillator 167 to an output of the rotation frequency control unit 37.

The sampling arrangement 66 comprises a first to a fourth sampling switch 72 to 75. The first sampling switch 72 couples the first converter input 19 to a first terminal of the capacitor array 68 and thus to a first electrode of the first sampling capacitor 69. The second sampling switch 73 couples the ground potential terminal 49 to the first terminal of the capacitor array 68 and thus to the first electrode of the first sampling capacitor 69. Thus, the first converter input 19 and the ground potential terminal 49 are coupled via the first and the second sampling switch 72, 73 to the first subset of capacitor elements of the capacitor array 68. Said first subset of capacitor elements of the capacitor array 68 is coupled via the third sampling switch 74 to the ground potential terminal 49 and via the fourth sampling switch 75 to the input side of the first integrator 40 and thus to the first input of the first amplifier 43. Therefore, a second electrode of the first sampling capacitor 69 and thus a second terminal of the capacitor array 68 is connected via the third and the fourth sampling switch 74, 75 to the ground potential terminal 49 and to the input side of the first integrator 40 and thus to the first input of the first amplifier 43.

The feedback arrangement 67 comprises a first feedback switch 77 coupling the first reference voltage input 34 to a third terminal of the capacitor array 68 and thus to a first electrode of the first feedback capacitor 70. Therefore, the first feedback switch 77 is arranged between the first reference voltage input 34 and the subset of capacitor elements of the capacitor array 68 that form the first feedback capacitor 70. A second feedback switch 78 couples the second voltage reference input 35 to the third terminal of the capacitor array 68 and thus to the first electrode of the first feedback capacitor 70. Moreover, the feedback arrangement 67 comprises a third feedback switch 79 coupling a fourth terminal of the capacitor array 68 and thus a second electrode of the first feedback capacitor 70 to the ground potential terminal 49. Moreover, a fourth feedback switch 80 couples the fourth terminal of the capacitor array 68 and thus the second electrode of the first feedback capacitor 70 to the input side of the first integrator 40 and thus to the first input of the first amplifier 43. Therefore, the subset of capacitor elements of the capacitor array 68 that form the first feedback capacitor 70 at a point of time are coupled via the third feedback switch 79 to the ground potential terminal 49 and via the fourth feedback switch 80 to the input side of the first integrator 40 and thus to the first input of the first amplifier 43. Moreover, the feedback arrangement 67 may comprise a fifth feedback switch 81 arranged such as the first feedback switch 77 and a sixth feedback switch 82 arranged such as the second feedback switch 78.

The timing control unit 36 is coupled to the control terminals of each of the switches of the AD converter 12. The timing control unit 36 is also coupled to an input of the rotation frequency control unit 37.

A ground potential Agnd is tapped at the ground potential terminal 49. The ground potential Agnd and the second reference voltage VRN may be equal. A reset signal SR is provided to the first and the second reset switch 45, 48 by the timing control unit 36. A first phase signal Φ1 is provided to the first sampling switch 72 and the first switch 52. A further first phase signal Φ1A is provided to the second feedback switch 78 and the second reference switch 61. A modified first phase signal Φ1a is provided to the third sampling switch 74, the third feedback switch 79, the third switch 54 and the fourth reference switch 63. An additional first phase signal Φ1B is provided to the first feedback switch 77 and the first reference switch 60.

A second phase signal Φ2 is provided to the second sampling switch 73, the second switch 53 and the third reference switch 62. A further second phase signal Φ2A is provided to the fifth feedback switch 81. A modified second phase signal Φ2a is provided to the fourth sampling switch 75, the fourth feedback switch 80, the fourth switch 55 and the fifth reference switch 64. An additional second phase signal Φ2B is provided to the sixth feedback switch 82.

The rotation frequency control unit 37 generates a rotation signal SRO that is provided to the capacitor array 68 via the output of the rotation frequency control unit 37. The rotation signal SRO determines which capacitor elements of the capacitor array 68 form the first sampling capacitor 69 and which other capacitor elements of the capacitor array 68 form the first feedback capacitor 70. The rotation frequency control unit 37 performs a rotation algorithm. Thus, a first subset of capacitor elements of the capacitor array 68 forms the sampling first capacitor 69 in a first phase and may form the first feedback capacitor 70 in a second phase, e.g. as a function of a rotation signal SRO. A further or second subset of capacitor elements of the capacitor array 68 may form the sampling first capacitor 69 in the second phase and may form the first feedback capacitor 70 in the first phase, e.g. as a function of the rotation signal SRO. The second phase is after the first phase. The rotation frequency control unit 37 receives a gain signal SG and determines the value of a rotation frequency fR of the rotation signal SRO as a function of the gain signal SG. The table stored in the memory 166 comprises pairs of possible values of the gain signal SG and values representing the corresponding frequency values of the rotation signal SRO. The divisor realized by the frequency divider 168 is set using the value representing the corresponding frequency value of the rotation signal SRO. The divisor is a function of the gain signal SG. The memory 166 also stores the information which capacitive element is used for the first sampling capacitor 69 and which capacitive element is used for the first feedback capacitor 70 at which clock cycle of the dynamic element rotation. The rotation frequency fR is the inverse of a rotation period TR of the rotation signal SRO. The rotation frequency control unit 37 may be named control unit, signal generator or sampling signal generator.

A detailed implementation of the merged PGA-AD converter 12 is shown in FIG. 2A. The gain drift of the AD converter 12 is compensated by using dynamic element rotation of the capacitive elements which form the first sampling capacitor 69 and the first feedback digital-to-analog (DAC) capacitor 70. Since the number of rotating capacitors are not the same for all gain settings, the rotation frequency fR of each unit capacitor changes depending on the programmed gain setting in order to get the tone due to capacitor mismatches at the same frequency regardless of the gain setting. The capacitive elements may be fabricated as unit capacitors.

The gains are implemented by changing both signal integrator weights, g1=C1/CINT1, and feedback DAC integrator weight g1'=CDAC1/CINT1. This implementation allows higher gain settings without increasing the area of the AD converter 12 on a semiconductor body. In order to keep the noise transfer function NTF of the SDM, shown in FIG. 5B, independent from the gain setting, the capacitance value CINT1 of the first integrating capacitor 44 is also programmed depending on the selected gain.

In FIG. 2A, the block diagram of the combined PGA-ADC is illustrated in a single-ended version. The single-ended block diagram of a resistive sensor front-end with an AD converter 12 is based on a second order sigma-delta modulator. The gain of the AD converter 12 is defined by equation (1):

$$Gain = \frac{g1}{g1'} = \frac{C1/Cint1}{CDAC1/Cint1} = \frac{C1}{CDAC1} \quad (1)$$

Thus, the gain of the AD converter 12 can be changed by changing the ratio between the capacitances C1 and CDAC1 of the first sampling capacitor 69 and the first feedback capacitor 70. In order to keep the same noise transfer function NTF for all gain settings, the capacitance value CINT1 is also selectable. The capacitance value CINT1 is adjusted whenever the capacitance value CDAC1 is changed. The gain signal SG sets the gain of the AD converter 12. The gain of the AD converter 12 is realized by selecting the number M of capacitor elements 171 of the first sampling capacitor 69 and the number N of capacitor elements 171 of the first feedback capacitor 70. Additionally, the gain of the AD converter 12 may optionally be realized by selecting the number of capacitor elements 171 of the first integrating capacitor.

FIG. 2B shows a further exemplary embodiment of the AD converter 12 and of the buffers 22 to 24 of the sensor arrangement 10 which is a further development of the AD converter and the buffers shown in FIGS. 1B and 2A. The AD converter 12 is realized as a differential AD converter. Thus, the AD converter 12 comprises a first path coupling the first converter input 19 to the output of the AD converter 12, for example to the output of the comparator 42, and a second path coupling the second converter input 20 to the output of the AD converter 12 such as a further output of the comparator 42.

The sampling arrangement 66 comprises a second sampling capacitor 90. Moreover, the sampling arrangement 66 comprises a fifth to an eighth sampling switch 91 to 94. The fifth sampling switch 91 couples a first electrode of the second sampling capacitor 90 to the second converter input 20. The sixth sampling switch 92 couples the first electrode of the second sampling capacitor 90 to the first converter input 19. The seventh sampling switch 93 couples a second electrode of the second sampling capacitor 90 to the ground potential terminal 49. The eighth sampling switch 94 of the sampling arrangement 66 couples the second electrode of the second sampling capacitor 90 to the input side of the first integrator 40. Contrary to the AD converter 12 shown in FIG. 2A, the second sampling switch 73 couples the first electrode of the first sampling capacitor 69 to the second converter input.

Thus, the first, second, fifth and sixth sampling switches 72, 73, 91, 92 perform a double sampling of an input differential voltage. The input differential voltage may be the difference between the first converter voltage VAP and the second converter voltage VAN.

The second sampling capacitor 90 is realized by a subset of capacitor elements of the capacitor array 68. The second sampling capacitor 90 has a capacitance value C2 that is variable. The capacitance value C2 of the second sampling capacitor 90 is controlled by the rotation signal SRO.

Additionally, the AD converter 12 may comprise an input chopping unit 96, coupling the first and the second converter input 19, 20 to the input side of the sampling arrangement 66. The input chopping unit 96 comprises a first to a fourth input switch 97 to 100. A first input switch 97 couples the first converter input 19 to the first sampling switch 72. A second input switch 98 couples the first converter input 19 to the fifth sampling switch 91. A third input switch 99 couples the second converter input 20 to the fifth sampling switch 91. Correspondingly, a fourth input switch 100 couples the second converter input 20 to the first sampling switch 72.

The output side of the sampling arrangement 66 is coupled via an integrator chopping unit 105 to the input side of the first integrator 40. The integrator chopping unit 105 comprises a first to a fourth chopping switch 106 to 109. The first chopping switch 106 couples the sampling arrangement 66 and thus the fourth sampling switch 75 to the first input of the amplifier 43. The second chopping switch 107 couples the sampling arrangement 66 and thus the fourth sampling switch 75 to the second input of the first amplifier 43. Correspondingly, the third chopping switch 108 couples the sampling arrangement 66 and thus the eighth sampling switch 94 to the first input of the second amplifier 46. The fourth chopping switch 109 couples the sampling arrangement 66 and thus the eighth sampling switch 94 to the second input of the first amplifier 43.

The feedback arrangement 67 comprises a second feedback capacitor 111. A first electrode of the second feedback capacitor 111 is coupled to the first and to the second reference voltage inputs 34, 35. Thus, the feedback arrangement 67 comprises a seventh to a twelfth feedback switch 112 to 117. The seventh to the twelfth feedback switch 112 to 117 are arranged such as the first to the sixth feedback switch 77 to 82. The second feedback capacitor 111 is realized by the capacitor array 68. Thus, a subset of capacitor elements of the capacitor array 68 forms the second feedback capacitor 111. The second feedback capacitor 111 has a variable capacitance value CDAC2. The capacitance value CDAC2 of the second feedback capacitor 111 is set by the rotation signal SRO.

The first, the second and the reference buffer 22 to 24 are realized as chopping buffers. Thus, the first buffer 22 comprises an input chopper unit 120 and an output chopper unit 121. The input of the first buffer 22 is coupled via the input chopper unit 120, the buffer amplifier 25, the output chopper unit 121 and the first switch 28 to the first converter input 19. A node between the output chopper unit 121 and the first switch 28 is connected to the input chopper unit 120. A node between the first switch 28 and the first converter input 19 is coupled via the second switch 29 to the input of the buffer 25. The first and the second switch 28, 29 are both realized as two parallel switches.

The second buffer 23 comprises an input chopper unit 122 and an output chopper unit 123. The reference buffer 24 comprises an input chopper unit 124 and an output chopper unit 125. The second and the reference buffer 23, 24 are realized such as the first buffer 22.

The first integrator 40 comprises a further first integrating capacitor 130 coupling the input side of the first amplifier 43 to the output side of the first amplifier 43. Also the first integrating capacitor 44 couples the input side of the first amplifier 43 to the output side of the first amplifier 43. The first integrator 40 comprises a further first reset switch 141 coupling a first electrode of the further first integrating capacitor 130 to a second electrode of the further first integrating capacitor 130.

The first integrator 40 comprises an amplifier input chopper 131 coupling the first electrode of the first integrating capacitor 44 and the first electrode of the further first integrating capacitor 130 to the first and the second input of the first amplifier 43. Furthermore, the first integrator 40 comprises an amplifier output chopper 132 coupling the second electrode of the first integrating capacitor 44 and the second electrode of the further first integrating capacitor 130 to a first and a second output of the first amplifier 43. The amplifier input chopper 131 comprises four chopper switches 133 to 136. The amplifier input chopper 131 comprises two blocks 131', 131" each having two of the four chopper switches 133 to 136. Also the amplifier output chopper 132 comprises four chopper switches 137 to 140. The amplifier output chopper 132 comprises two blocks 132', 132" each having two of the four chopper switches 137 to 140.

The amplifier input chopper 131 is configured such that the first and the second chopper switch 133, 134 couple the first electrode of the first integrating capacitor 44 to the first and the second input of the first amplifier 43. The third and the fourth chopper switch 135, 136 couple the first electrode of the second integrating capacitor 130 to the first and the second input of the first amplifier 43.

The amplifier output chopper 132 is configured such that the first and the second chopper switch 137, 138 couple the second electrode of the first integrating capacitor 44 to the first and the second output of the first amplifier 43. The third and the fourth chopper switch 139, 140 couple the second electrode of the second integrating capacitor 130 to the first and the second output of the first amplifier 43.

The first capacitor switching circuit 50 couples the output side of the first integrator 40 to the input side of the second integrator 41. The first capacitor switching circuit 50 couples the second electrodes of the first integrating capacitor 44 and of the further first integrating capacitor 130 to the input side of the second integrator 41 and thus to the first and the second input of the second amplifier 46. As shown in FIGS. 2A and 2B, the second electrode of the first integrating capacitor 44 is coupled via the first switch 52 to the first electrode of the first switching capacitor 51.

The first capacitor switching circuit 50 comprises a second switching capacitor 145 and a fifth to an eighth switch 146-149. A first electrode of the second switching capacitor 145 is coupled via the fifth switch 146 to the second electrode of the further first integrating capacitor 130 and via the sixth switch 147 to the ground potential terminal 49. A second electrode of the second switching capacitor 145 is coupled via the seventh switch 148 to the ground potential terminal 49 and via the eighth switch 149 to the second integrator 41 and thus to the second input of the second amplifier 46.

The second capacitor switching circuit 56 couples the first and the second reference voltage input 34, 35 to the input side of the second integrator 41 and thus to the first and the second input of the second amplifier 46. The second capacitor switching circuit 56 comprises a second reference switching capacitor 150 and a sixth to a twelfth reference switch 151 to 155 which are configured such as the first reference switching capacitor 59 and the first to the fifth reference switch 60 to 64.

The second integrator 41 comprises a further second integrating capacitor 160 coupling the second input of the second amplifier 46 to a second output of the second amplifier 46. A further second reset switch 161 couples a first electrode of the further second integrating capacitor 160 to a second electrode of the further second integrating capacitor 160.

The comparator 42 has a first input connected to the first output of the second integrator 41 and thus to the first output of the second amplifier 46. Moreover, said comparator 42 has a second input coupled to a second output of the second integrator 41 and thus to the second output of the second amplifier 46. The comparator 42 comprises the output and a further output. The output and the further output of the comparator 42 are coupled via two comparator switches 164, 165 to the output of the AD converter 12 and thus to the input of the filter 38. Alternatively, the filter 38 may be part of the AD converter 12.

The capacitor elements of the capacitor array 68 are used to realize the first and the second sampling capacitor 69, 90 and the first and the second feedback capacitor 70, 111. A subset of the capacitor elements of the capacitor array 68 is used for the realization of the first sampling capacitors 69, another subset of capacitor elements is used for the realization of the second sampling capacitor 90, a further subset of capacitor elements is used to realize the first feedback capacitor 70 and an additional subset of capacitor elements is used to implement the second feedback capacitor 111 at a point of time. The rotation signal SRO determines which of the capacitor elements is allocated to which capacitor, namely the first and the second sampling capacitor 69, 90 and the first and the second feedback capacitor 70, 111. The rotation signal SRO is not a constant signal during one period of conversion of the first and/or the second converter voltage VAP, VAN to the digital output signal DOUT. The rotation frequency fR is a variable frequency and is not constant.

Thus, the positioning or allocation of the different capacitor elements of the capacitor array 68 to the first and the second sampling capacitor 69, 90 and the first and the second feedback capacitor 70, 111 is dynamic and is not constant during one period of conversion. The change of the positioning is performed at different values of the rotation frequency fR. The value of the rotation frequency fR depends on a gain signal SG. The value of the rotation frequency fR depends on the gain that is realized by the AD converter 12. The gain that is realized by the AD converter 12 is set by the gain signal SG. The gain signal is received by the timing control unit 36 and/or the rotation frequency control unit 36.

A high input impedance is achieved by using the buffers 22 to 24 in the first-half of the sampling and integration phase for the inputs and the ADC reference nodes, using buffer control signals Φ1BU, Φ2BU. In the second half of such phases, the buffers 22 to 24 are bypassed using buffer control signals Φ1BN, Φ2BN. The buffer control signals Φ1BN, Φ2BN are inverted signals to the buffer control signals Φ1BU, Φ2BU.

Advantageously, the dynamic element rotating frequency fR is programmed depending on the gain setting. The dynamic element rotation does not take place at a fixed frequency.

Advantageously, the PGA gain setting is programmed by varying the integrator weights g1 (C1/CINT1) and g1' (CDAC/CINT1). In fact, the gain programmability is implemented by changing the capacitance value C1 of the first sampling capacitor 69. The adjustment of the capacitance value CINT1 is realized for keeping the same noise transfer function NTF for all gain settings. According to the used dynamic rotation algorithm, the number of capacitor elements of the capacitor array 68 involved varies according to the gain setting.

Advantageously, the merged PGA-AD converter 12 is implemented combined together with the buffers 22-24 at its input and reference voltage, with the dynamic element rotation, the local and system level chopping. This allows having a sensor front-end with stable gain and offset and high input impedance.

Advantageously, a reduction of noise, area and current consumption is achieved, since the PGA is merged in the AD converter 12. The noise is reduced, since the noise transfer function NTF is constant for all gain setting. Tones coming from the dynamic element rotating are always adjusted to fall in a notch of the digital filter 38. An area reduction is achieved, since higher gains are implemented by reducing the feedback DAC capacitors 70, 111. Advantageously, an input signal bandwidth is the same for all gain settings.

In FIG. 2B, a fully differential block diagram of a resistive sensor front-end with a digital converter based on a second order sigma-delta modulator is shown. In a fully differential version, as shown in FIG. 2B, the gain of the ADC 12 is defined by equation (2):

$$Gain = 0.5 \cdot \left(\frac{g1}{g1'} + \frac{g2}{g2'}\right) = \qquad (2)$$

$$0.5 \cdot \left(\frac{\frac{C1}{CINT1}}{\frac{CDAC1}{CINT1}} + \frac{\frac{C2}{CINT1}}{\frac{CDAC2}{CINT1}}\right) = 0.5 \cdot \left(\frac{C1}{CDAC1} + \frac{C2}{CDAC2}\right)$$

In case of the fully differential version, the gain is a function of the capacitance values C1, C2, CDAC1 and CDAC2.

The output side of the first integrator 40 is coupled to the input side of the comparator 42. In an alternative, not shown embodiment, the second integrator 41 may be omitted.

FIG. 3 shows an exemplary embodiment of a detail of the AD converter 12 described above. In FIG. 3, a unit element 170 of the dynamic element rotation is shown. The capacitor array 68 comprises a plurality of unit elements 170 as shown in FIG. 3. The unit element 170 comprises a capacitor element 171 and at least two switches 172 to 175 coupling a first electrode of the capacitor element 171 to the respective terminals of the sampling arrangement 66 and the feedback arrangement 67. Moreover, the unit element 170 comprises at least two further switches 176 to 179 coupling a second electrode of the capacitor element 171 to the respective terminals of the sampling arrangement 66 and the feedback arrangement 67. The switches 172 to 179 have control terminals connected to a control logic 180 of the unit element 170. The control logic 180 is connected on its input side to the rotation frequency control unit 71. Thus, the capacitor array 68 comprises a plurality of capacitor elements 171 and switches 172 to 179.

The rotation signal SRO may be realized as a selection signal. The rotation signal SRO is provided to the control logic 180 such that exactly one of the switches 172 to 175 that are connected to the first electrode of the capacitor element 171 and exactly one of the switches 176 to 179 that are connected to the second electrode of the capacitor element 171 are in a conducting state. Alternatively, the control logic 180 sets none switch of the switches 172 to 179 in a conducting state. The control logic 180 may comprise a memory that stores the sequence or different sequences of the switches 172 to 179 which are set in a conducting state such that the capacitive element 171 is used for the first sampling capacitor 69 or the first feedback capacitor 70, e.g. at which clock cycle of the dynamic element rotation.

Alternatively, the control logic 180 is coupled to the memory 166 in order to receive information about the actual sequence.

For the realization of the AD converter 12 shown in FIG. 2B, four switches 172 to 175 are connected to the first electrode and four switches 176 to 179 are connected to the second electrode of the capacitor element 171. Thus, a capacitor element 171 either contributes to one of the capacitors of a group consisting of the first sampling capacitor 69, the second sampling capacitor 90, the first feedback capacitor 70 and the second feedback capacitor 111 or is set in an idle state.

For the realization of the AD converter 12 shown in FIG. 2A, two switches 172, 173 are connected to the first electrode and two switches 176, 177 are connected to the second electrode of the capacitor element 171. Thus, a capacitor element 171 either contributes to one of the capacitors of a group consisting of the first sampling capacitor 69 and the first feedback capacitor 70 or is set in an idle state.

Each of the capacitor elements 171 of the capacitor array 68 may have the identical unit capacitance value Cu. The implementation of the unit capacitance Cu of the capacitor element 171 is used for implementing the integrator weights. The rotation frequency control unit 37 that is realized as a rotation algorithm unit provides the rotation signal SRO that is a selection signal for each unit capacitance. Each capacitor element 171 can be part of C1, C2, CDAC1 and CDAC2 or is not in use. In this case, the capacitor element 171 is connected to a common mode voltage vagnd. The common mode voltage vagnd may be equal to the ground potential Agnd. The number of the rotating capacitor elements 171 is not constant but depends on the selected modulator gain. The previous equation (1) can be re-written as an equation (3):

$$Gain = \frac{g1}{g1'} = \frac{C1}{CDAC1} = \frac{M \cdot Cu}{N \cdot Cu} = \frac{M}{N}, \qquad (3)$$

wherein M and N are the numbers of capacitor elements 171 used for implementing of the capacitance values C1 and CDAC1 respectively.

Mismatches between the capacitor elements 171 are observed at the output spectrum of the ADC 12 as a tone which is located at the rotation frequency fR. Every capacitor element 171 involved in the gain implementation must be used the same amount of times in the same location every period of rotation. Thus, a complete dynamic element rotation cycle takes a number NC of rotation cycles:

$$NC = k \cdot \left(\frac{M + N}{gcd(M, N)}\right) \qquad (4)$$

Thus, the number NC of rotation cycles during a conversion period is a function of the gain and thus of the gain signal SG. In order to get the mismatch tone at the filtered out, the tone due to the capacitor mismatch is located at one of the notch frequencies fN, also named $F_{notch}$, of the digital filter 38. The number of notch frequencies of the filter 38 may be 1, 2, 3 or more than 3. Thus, the rotation frequency fR, also named $F_{rotation}$, at which each unit is changing its location is:

$$fR = \left(k \cdot \frac{M+N}{gcd(M,N)}\right) \cdot fN \qquad (5)$$

Being k an integer number and gcd the abbreviation of the greatest common divisor. The signal transfer function STF of a generic second order cascaded SDM is:

$$STF(z) = \frac{g_1 \cdot g_2 \cdot z^{-2}}{(1 + g_1' \cdot g_2 - g_2') \cdot z^{-2} + (g_2' - 2) \cdot z^{-1} + 1} \qquad (6)$$

Whereas the noise transfer function NTF is:

$$NTF(z) = \frac{z^{-1} - 2 \cdot z^{-1} + 1}{(1 + g_1' \cdot g_2 - g_2') \cdot z^{-2} + (g_2' - 2) \cdot z^{-1} + 1} \qquad (7)$$

Figure 5A:
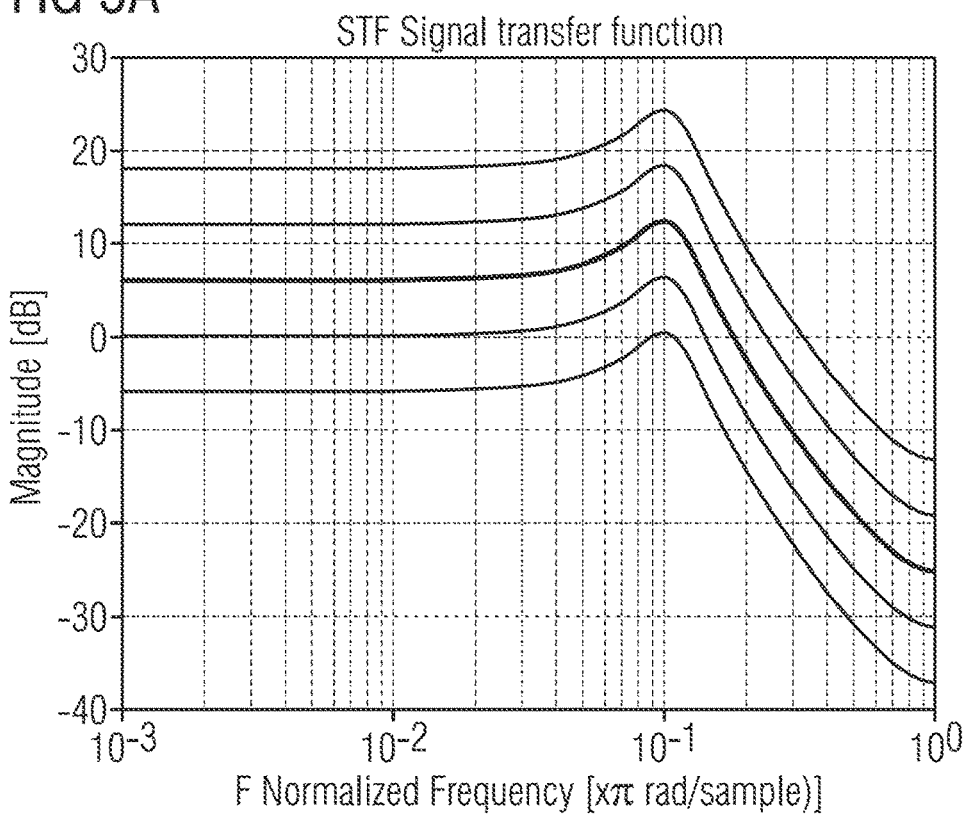
FIGS. 5A and 5B show exemplary characteristics of an AD converter.
Figure 5B:
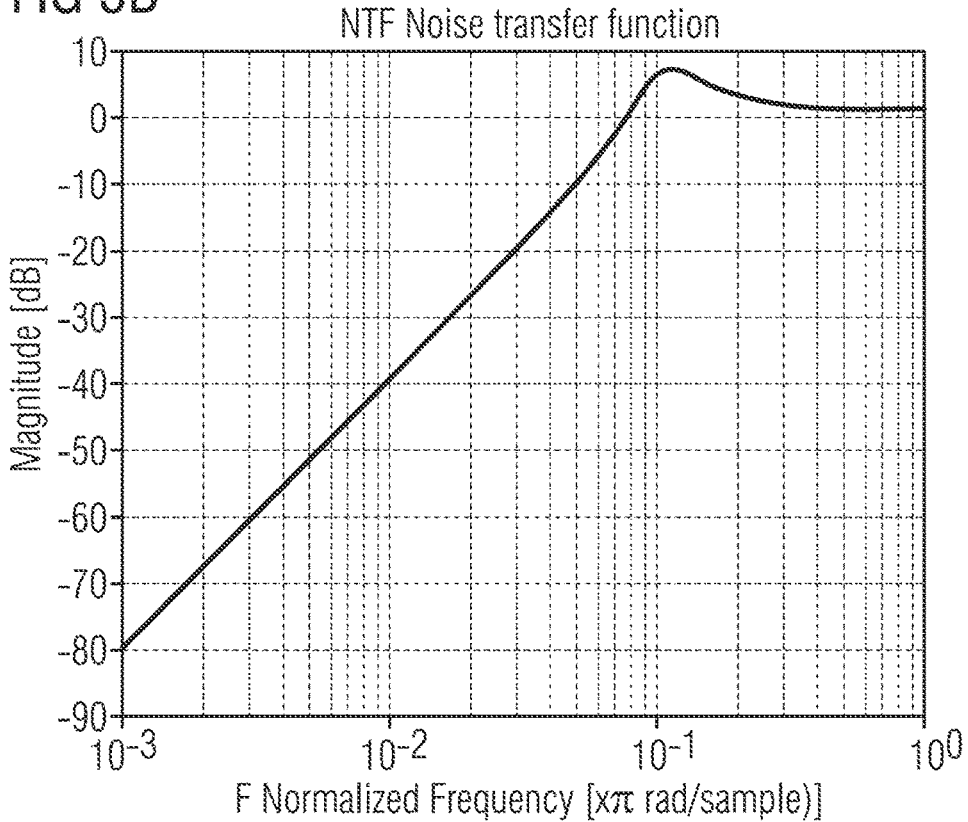

Both signal and noise transfer function STF, NTF are shown in FIGS. 5A and 5B.

If a differential ADC input current Idiff is considered, the gain error caused by such differential current is:

$$\frac{\Delta G}{G} = \frac{Idiff \cdot R}{VRP} \qquad (8)$$

In order to reduce the differential input current, several techniques are implemented, instead of charging the ADC capacitors through the resistors of the sensors, a fast capacitor charge is performed by the input buffers 22-24 at the first half of the sampling phase. At the end of the phase in which the buffers 22-24 are connected, the capacitors are charged to the input voltage. However, an error in the charged voltage will be present due to finite open-loop gain of the operational amplifier, offset and incomplete settling. The resistors needs then to charge such voltage error voltage in the next half sampling phase. The charging of such voltage error requires input current flowing to the AD converter 12 which implies a gain error. Such gain error is reduced by using chopping in the buffers 22 to 24 and by chopping the whole AD converter 12.

In an embodiment, the sampling arrangement 66 may be realized as a sample-and-hold circuit. The capacitor elements 171 of the capacitor array 68 may be rotated to perform a dynamic element matching technique, e.g. in order to reduce the gain error of the first integrator 40 and further errors.

FIG. 4A shows an exemplary embodiment of signals of the AD converter 12 described above. In FIG. 4A, a measurement timing diagram is illustrated. The signals are shown as a function of a time t. In FIG. 4A, the following signals are shown: an enable signal PD, the reset signal SR, a signal SDER, a buffer chopper signal CB, an input chopping signal CA and the rotation signal SRO. The enable signal PD may enable operation of the AD converter 12. At a change of the enable signal PD, the ADC 12 performs the analog-to-digital conversion.

The reset signal SR has short pulses and is generated at the start of the AD conversion. The reset signal SR sets the reset switches 45, 48, 141, 161 in a conducting state. During AD conversion, said reset switches 45, 48, 141, 161 are set in a non-conducting state by the reset signal SR.

The rotation period TR of the rotation signal SRO is equal to the inverse of the rotation frequency fR. The rotation signal SRO is periodically repeated with the rotation period TR. The rotation period TR of the rotation signal SRO can be calculated according to the equation:

$TR=1/fR$, wherein fR is the frequency of the rotation signal SRO. The capacitor element 171 goes through the predetermined positions during one rotation period TR. During one rotation period TR, the different capacitor elements 171 of the capacitor array 68 are switched into the different positions (or go through the different positions) to realize the first and the second sampling capacitor 69, 90 and the first and the second feedback capacitor 70, 111. In the rotation period TR, each of the capacitor elements 171 or each of the first subset of capacitor elements 171 goes one-time through the predetermined positions.

The signal SDER can also be called "dynamic element rotation signal". The signal SDER may be a part of the rotation signal SRO. The signal SDER may be applied to the control terminal of the switches 172 and 176 of the unit element 170 shown in FIG. 3. Thus, the capacitor element 171 is either connected to the terminals for example of the sampling arrangement 66 or is not connected to the terminals of the sampling arrangement 66. The rotation signal SRO may comprise several dynamic element rotation signals SDER. For each of the unit elements 170, a separate dynamic element rotation signal SDER may be generated.

The dynamic element rotation signals SDER performs NY cycles during a duration when the buffer chopper signal CB is equal to a first logical level. The dynamic element rotation signals SDER performs NY cycles during a duration when the buffer chopper signal CB is equal to a second logical level.

An element period TE of the dynamic element rotation signal SDER is equal to the inverse of an element frequency fE. The element frequency fE is higher than the rotation frequency fR. The rotation frequency fR and the rotation period TR can be calculated according to the equations:

$fR=fE/A$ and $TR=TE \cdot A$, wherein fE is the element frequency, TE is the element period and A is a constant. The constant A may be the number of different states for going through the different positions. The constant A may follow the equation: A≤N, with N is the number of cycles described above. The value NY of the NY cycles of the dynamic element rotation signals SDER may be a whole-number multiple of the constant A. The element frequency fE may be a variable frequency. Alternatively, the element frequency fE may be constant.

The buffer chopper signal CB is provided to the input chopper units 120, 122, 124 and the output chopper units 121, 123, 125 of the three buffers 22 to 24. The input chopping signal CA and a signal CAQ which is the inverse of the input chopping signal CA are provided to the input chopping unit 96.

In FIG. 4A, the timing diagram of one conversion cycle is shown. The chopping signal CB of the input buffers and the input chopping signal CA are depicted. The chopping of the whole AD converter 12 also helps to reduce the remaining offset which was not totally corrected by chopping the integration capacitors. The number NC of cycles of the dynamic element rotation is programmed in such way that the frequency tone due to the rotation is set to be in a notch of the digital frequency. Since the number of capacitor elements 171 which are rotating depends on the gain setting, the rotation frequency fR of the dynamic element rotation is set to be dependent on the programmed gain.

Figure 4B:
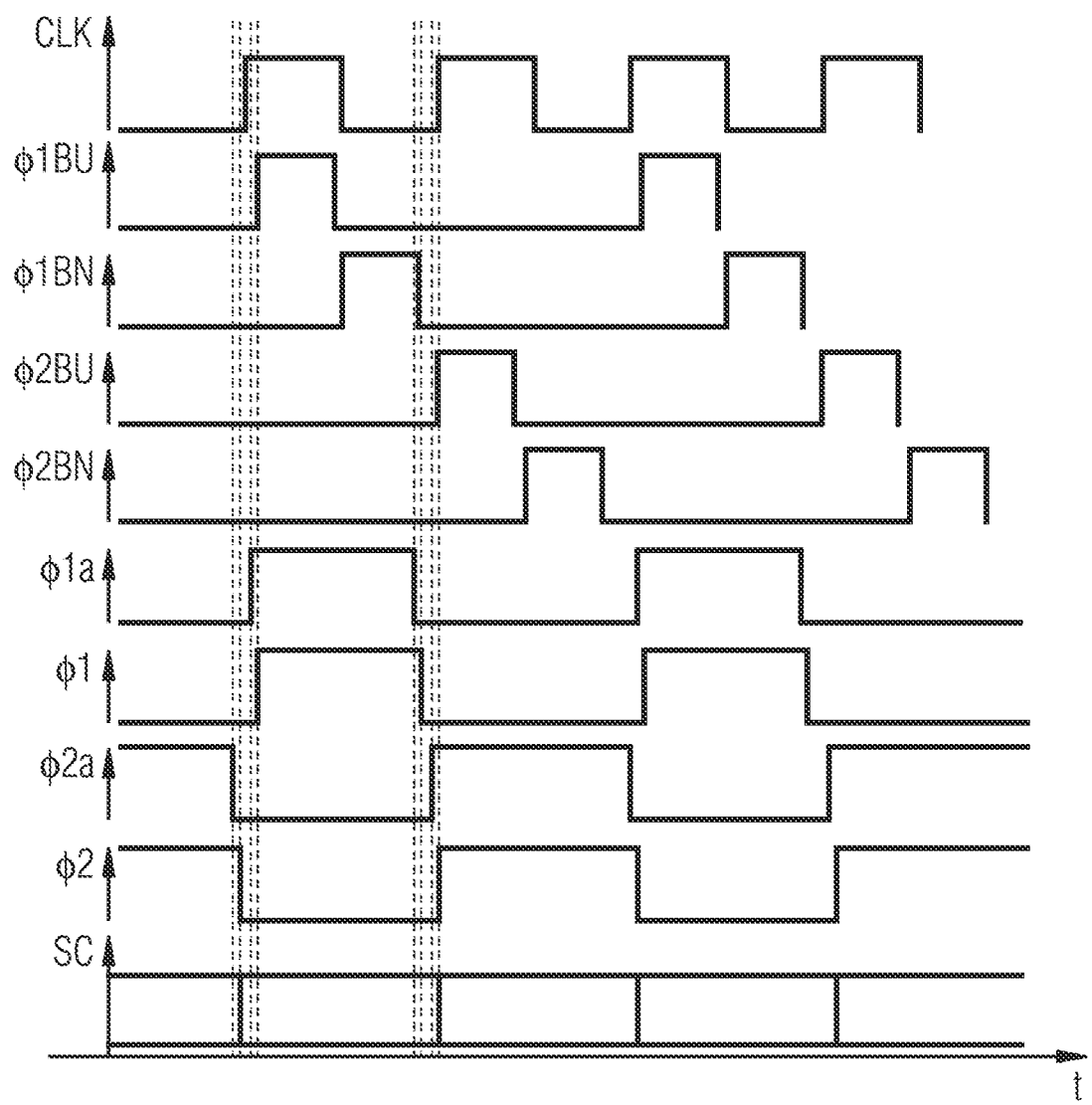

FIG. 4B shows a further exemplary embodiment of signals generated by the AD converter 12. The following signals are shown in FIG. 4B: The clock signal CLK, the buffer control signals Φ1BU, Φ1BN, Φ2BU, Φ2BN, the first phase signals Φ1a, Φ1, the second phase signals Φ2a, Φ2 and a comparator output signal SC. The first phase signal Φ1 is a delayed signal with respect to the first phase signal Φ1a. Correspondingly, the second phase signal Φ2 is a delayed signal referring to the second phase signal Φ2a. The comparator output signal SC is tapped at the output of the comparator 42 and has the values "1" or "0" depending on the comparison of the voltages provided to the first and the second input of the comparator 42. In FIG. 4B, an ADC and buffer clock phases timing diagram is shown.

FIG. 5A shows an exemplary characteristic of the AD converter 12 described above. A magnitude of the signal transfer function STF as a function of a normalized frequency F is shown. In FIG. 5A, the SDM signal transfer function STF for five different PGA settings is illustrated.

FIG. 5B shows a further exemplary characteristic of the AD converter 12 described above. The noise transfer function NTF is illustrated in FIG. 5B. A magnitude of the NTF is shown as a function of the normalized frequency F. In FIG. 5B, SDM noise transfer function NTF for all PGA settings is illustrated. The NTF function is nearly identical for the five different PGA settings. The resolution of the AD conversion is increased due to the low values of the NTF and the independence of the NTF from the gain of the ADC 12.

The sensor arrangement 10 and the AD converter 12 shown in FIGS. 1A, 1B, 2A and 2B can be used for resistive measurements. A dynamic element rotating is performed in a switched capacitor PGA with a programmable clock frequency which depends on the PGA gain setting. The integrator weight is programmable which achieves constant signal bandwidth and the same noise transfer function NTF for all PGA settings. The dynamic element rotating algorithm is described by the equation (5).

The invention claimed is:

1. An analog-to-digital converter,
wherein the analog-to-digital converter is implemented as a sigma-delta analog-to-digital converter and comprises
a first integrator,
a first converter input at which a first converter voltage is tapped,
a first reference voltage input,
a capacitor array comprising capacitor elements, and
a rotation frequency control unit providing a rotation signal with at least two different values of a rotation frequency,
wherein a capacitor element changes its location at the rotation frequency, and
wherein a first subset of capacitor elements of the capacitor array is coupled to the first converter input and to an input side of the first integrator in a first phase and is coupled to the first reference voltage input and to the input side of the first integrator in a second phase as a function of the rotation signal.

2. The analog-to-digital converter according to claim 1, wherein a value of the rotation frequency of the rotation signal depends on a gain signal.

3. The analog-to-digital converter according to claim 2, wherein a gain of the first integrator is set by the gain signal.

4. The analog-to-digital converter according to claim 3, wherein the first integrator comprises a first amplifier and a first integrating capacitor having a number of further capacitor elements and
wherein a subset of the further capacitor elements of the first integrating capacitor is coupled to an input side of the first amplifier and to an output side of the first amplifier and the number of further capacitor elements in the subset is a function of the gain signal.

5. The analog-to-digital converter according to claim 1, wherein the analog-to-digital converter comprises a second integrator coupled to the first integrator and a comparator coupled to the second integrator.

6. The analog-to-digital converter according to claim 5, wherein the analog-to-digital converter comprises a filter coupled to the comparator that is one of a group consisting of a digital decimation filter, a low pass filter, a band-stop filter and a notch filter.

7. The analog-to-digital converter according to claim 1, wherein the analog-to-digital converter is realized as a differential analog-to-digital converter and comprises
a second converter input and
a second reference voltage input,
wherein the capacitor array couples the second converter input and the second reference voltage input to the input side of the first integrator.

8. A sensor arrangement, comprising
the analog-to-digital converter according to claim 1 and
a sensor that is configured as a resistive sensor and is coupled to the first converter input,
wherein a first converter voltage that is tapped at the first converter input is a function of a parameter measured by the sensor.

9. The sensor arrangement according to claim 8,
wherein the sensor arrangement comprises
a first buffer coupled on its input side to the sensor and on its output side to the first converter input and being realized as a chopping buffer, and
a reference buffer coupled on its input side to a reference voltage terminal and on its output side to the first reference voltage input and being realized as a chopping buffer.

10. A method for analog-to-digital conversion,
wherein an analog-to-digital converter is implemented as a sigma-delta analog-to-digital converter and comprises a first integrator a first converter input a first reference voltage input, a capacitor array and a rotation frequency control unit,
wherein the method comprises
providing a first converter voltage that is tapped at the first converter input and a first reference voltage that is tapped at the first reference voltage input via the capacitor array that comprises capacitor elements to the first integrator, and
providing a rotation signal by the rotation frequency control unit with a rotation frequency having a first or alternatively at least a second value,
wherein a capacitor element changes its location at the rotation frequency, and
wherein a first subset of capacitor elements of the capacitor array is coupled to the first converter input and to an input side of the first integrator in a first phase and is coupled to the first reference voltage input and to the input side of the first integrator in a second phase as a function of the rotation signal.

11. The method according to claim 10,
wherein a comparator output signal is provided by a comparator that is coupled via a second integrator to the output side of the first integrator.

12. The method according to claim 11,
wherein a value of the rotation frequency at which one of the capacitor elements is changing its location is given by the equation:

$$fR = \left(k \cdot \frac{M+N}{gcd(M,N)}\right) \cdot fN,$$

wherein k is an integer number, M is the number of capacitor elements of the capacitor array coupled to the first converter input and to an input side of the first integrator in the first phase, N is the number of capacitor elements of the capacitor array coupled to the first reference voltage input and to an input side of the first integrator in the first phase, gcd is the greatest common divisor and fN is a value of a notch frequency of a filter coupled to the output side of the comparator.

13. An analog-to-digital converter, comprising
a first integrator,
a first converter input,
a first reference voltage input,
a capacitor array comprising capacitor elements, and
a rotation frequency control unit providing a rotation signal,
wherein a first subset of capacitor elements of the capacitor array is coupled to the first converter input and to an input side of the first integrator in a first phase and is coupled to the first reference voltage input and to the input side of the first integrator in a second phase as a function of the rotation signal.

14. The analog-to-digital converter according to claim 13, wherein the rotation signal has at least two different values of a rotation frequency.

\* \* \* \* \*